(12) United States Patent
Shiozawa et al.

(10) Patent No.: US 7,378,351 B2
(45) Date of Patent: May 27, 2008

(54) METHOD OF MANUFACTURING NITRIDE SEMICONDUCTOR DEVICE

(75) Inventors: Katsuomi Shiozawa, Tokyo (JP);
Toshiyuki Oishi, Tokyo (JP);
Kazushige Kawasaki, Tokyo (JP);
Zempei Kawazu, Tokyo (JP); Yuji Abe, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 64 days.

(21) Appl. No.: 11/143,685

(22) Filed: Jun. 3, 2005

(65) Prior Publication Data

US 2006/0003490 A1 Jan. 5, 2006

(30) Foreign Application Priority Data

Jun. 3, 2004 (JP) ............................... 2004-165718

(51) Int. Cl.
*H01L 21/302* (2006.01)
*H01L 21/461* (2006.01)
(52) U.S. Cl. ............... 438/706; 438/106; 257/E21.172; 257/E21.222
(58) Field of Classification Search ................ 438/706, 438/106; 257/E21.172, E21.222
See application file for complete search history.

(56) References Cited

U.S. PATENT DOCUMENTS 6,791,120 B2 9/2004 Toda et al.
6,890,779 B2 5/2005 Toda et al.
2004/0229390 A1* 11/2004 Seo .............................. 438/22

FOREIGN PATENT DOCUMENTS

| JP | 11186605 A | * | 7/1999 |
| JP | 3398896 B2 | * | 4/2003 |
| JP | 2003-347660 | | 12/2003 |
| JP | 2003347660 | * | 12/2003 |
| JP | 2004-6718 | | 1/2004 |
| JP | 2004-71657 | | 3/2004 |

OTHER PUBLICATIONS

Hui-Ching Hsin et al. (Journal of Material Science: Materials in Electronics 13 (2002) 203-206).*

* cited by examiner

*Primary Examiner*—Nadine G. Norton
*Assistant Examiner*—Mahmoud Dahimene
(74) *Attorney, Agent, or Firm*—Oblon, Spivak, McClelland, Maier & Neustadt, P.C.

(57) ABSTRACT

A nitride semiconductor device is manufactured by the step of forming a nitride semiconductor layer form on a GaN substrate main surface, the step of polishing a back surface of the GaN substrate formed with the above-mentioned nitride semiconductor layer, the step of dry etching the back surface of the GaN substrate subjected to the above-mentioned polishing by using a gas mixture of chlorine and oxygen, and the step of forming an n-type electrode on the back surface of the GaN substrate subjected to the above-mentioned dry etching.

4 Claims, 1 Drawing Sheet

F I G . 1
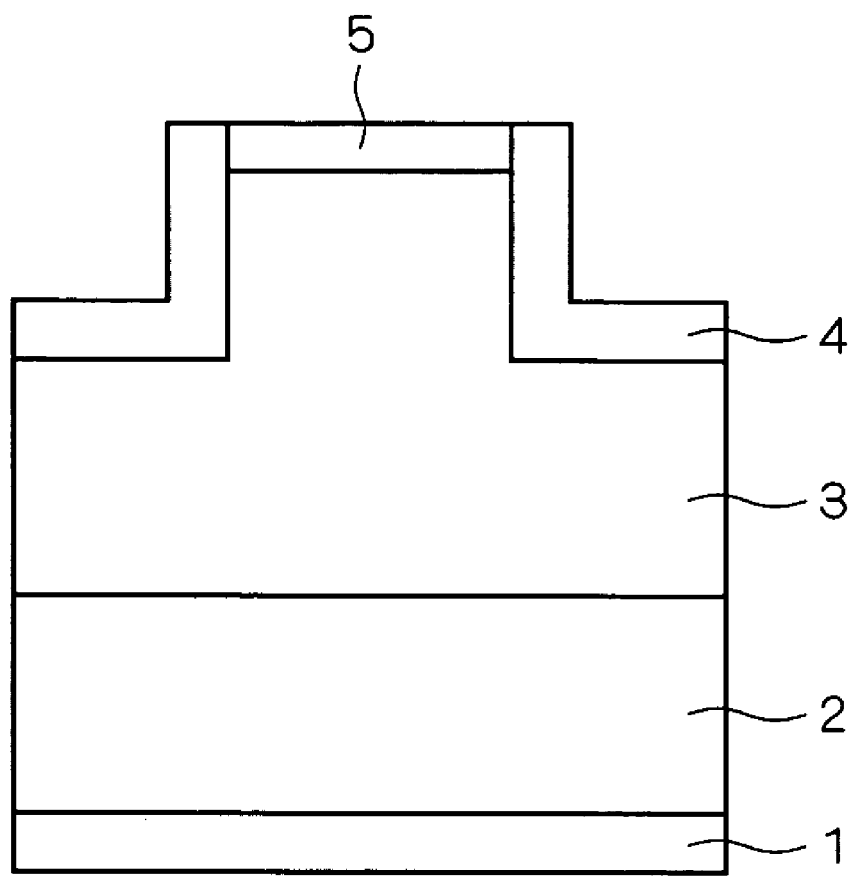

METHOD OF MANUFACTURING NITRIDE SEMICONDUCTOR DEVICE

BACKGROUND OF THE INVENTION

1. Field of the Invention

The present invention relates to a method of manufacturing a nitride semiconductor device for use in a laser diode.

2. Description of the Background Art

Because a nitride semiconductor has a large bandgap, gallium nitride (GaN) has particularly been used for a laser diode (LD). In the LD of GaN, an n-type electrode is formed on the back surface of a GaN substrate. In this case, it is necessary to make the substrate thin prior to the formation of the n-type electrode, and the GaN substrate is polished. This polishing, however, causes an altered layer to be formed on a polished surface of the substrate to increase a contact resistance with the n-type electrode to be formed on this surface. A method of reducing this contact resistance includes a method of performing heat treatment at a high temperature of about 700° C. after the n-type electrode is formed. The processing at such a high temperature, however, presents a problem such that a p-type electrode provided on the GaN substrate is degraded.

A solution to such a problem is a method of dry etching the polished surface using a halogen gas as an etching gas after the polishing of the GaN substrate to remove the altered layer generated on the polished surface, and performing heat treatment at a temperature of not less than 400° C. after electrode formation to reduce the contact resistance with the n-type electrode. (See, for example, Japanese Patent Application Laid-Open No. 2003-347660 (pp. 4-5)).

As the LD advances toward ever smaller size and higher power, power inputted to the LD increases, and a further reduction in the contact resistance of the electrode is desired. The method of dry etching the polished surface using the halogen gas to remove the altered layer still has problems in that there is a limit to the reduction in the contact resistance of the n-type electrode and in that the heat treatment at the high temperature of not less than 400° C. is required to reduce the contact resistance.

SUMMARY OF THE INVENTION

The present invention has been made to solve the above-mentioned problems. It is an object of the present invention to provide a method of manufacturing a nitride semiconductor device including a dry etching step for a polished substrate surface which is capable of achieving a contact resistance of an n-type electrode at a low level usable for a high-power LD without the need for heat treatment at a high temperature of not less than 400° C.

A method of manufacturing a nitride semiconductor device according to the present invention is a method of manufacturing a nitride semiconductor device using a GaN substrate, which comprises the step of forming a nitride semiconductor layer on a GaN substrate main surface, the step of polishing a back surface of the GaN substrate formed with the above-mentioned nitride semiconductor layer, the step of dry etching the back surface of the GaN substrate subjected to the above-mentioned polishing by using a gas mixture of chlorine and oxygen, and the step of forming an n-type electrode on the back surface of the GaN substrate subjected to the above-mentioned dry etching.

According to the method of manufacturing the nitride semiconductor device of the present invention, the nitride semiconductor device having the contact resistance of the n-type electrode taking a low value not obtainable by dry etching using only a chlorine gas is provided without performing heat treatment at a high temperature of not less than 400° C.

These and other objects, features, and advantages of the present invention will become more apparent from the following detailed description of the present invention when taken in conjunction with the accompanying drawings.

BRIEF DESCRIPTION OF THE DRAWINGS

FIG. 1 is a schematic view showing a structure of a nitride semiconductor device obtained by a manufacturing method according to the present invention.

DESCRIPTION OF THE PREFERRED EMBODIMENTS

First Preferred Embodiment

A GaN substrate has a Ga surface containing a lot of gallium (Ga) and an N surface containing a lot of nitrogen (N), and a contact resistance (Rc) of an n-type electrode is lower on the Ga surface than on the N surface. Because the back surface on which the n-type electrode of the GaN substrate is to be provided is the N surface, the N surface appears if an altered layer is removed by the conventional etching using a halogen gas, and there is a limit to the reduction in Rc. The present invention, therefore, is completed by finding a method of reducing a nitrogen content in the surface on which the n-type electrode is to be provided to further reduce the Rc of the n-type electrode.

FIG. 1 is a schematic view showing a structure of a nitride semiconductor device obtained by a manufacturing method according to the present invention.

As illustrated in FIG. 1, a nitride semiconductor device 6 is provided with a semiconductor layer 3 on a main surface of a GaN substrate 2, and is provided with an n-type electrode 1 on a back surface of the GaN substrate 2. An insulation film 4 of $SiO_2$ is provided on a peripheral portion of an upper surface of the semiconductor layer 3, and a p-type electrode 5 is provided on a central portion of the upper surface of the semiconductor layer 3.

Next, a method of manufacturing a nitride semiconductor device according to the present invention will be illustrated.

First, the back surface of a GaN substrate is doped with an n-type impurity so as to have n-type conductivity. Next, a semiconductor layer made of a nitride semiconductor or a compound semiconductor is formed on a GaN main surface side, and a p-type electrode is formed on the formed semiconductor layer surface.

Next, the back surface of the GaN substrate is removed about 200 to 300 μm by grinding and polishing so that the GaN substrate has a thickness of 100 to 200 μm. Specifically, a grinding machine is used to grind almost 200 to 300 μm. Thereafter, a diamond slurry is used to planarize the surface. Finally, polishing with a polishing cloth is performed by using alumina as an abrasive.

Next, an altered layer generated on the polished surface of the above-mentioned GaN substrate is removed by high-frequency inductively coupled plasma (ICP) dry etching using a gas mixture of chlorine and oxygen as an etching gas. Etching conditions in this case include a temperature of 20 to 60° C., a pressure of 0.2 to 0.5 Pa, a gas flow rate of 25 to 50 sccm, a bias power of 20 to 50 W, and an etching amount of about 0.5 to 2 μm.

The use of the gas mixture of chlorine and oxygen as the etching gas promotes the removal of nitrogen from the N surface of the GaN substrate because oxygen reacts with nitrogen in the GaN substrate. This removes the altered layer and also reduces the ratio of nitrogen to gallium (N/Ga) in the Ga N substrate surface after the removal of the altered layer.

In particular, an oxygen content (m) of 5 to 20% in the etching gas mixture of chlorine and oxygen provides the (N/Ga) ratio of 0.75 to 0.55 in the post-etching surface of the GaN substrate.

Herein, m (%) is the partial pressure percentage of oxygen calculated from Equation (1) below.

$$m = \{P_{O_2}/(P_{Cl_2} + P_{O_2})\} \times 100 \tag{1}$$

where $P_{O_2}$ is the partial pressure of an oxygen gas, and $P_{Cl_2}$ is the partial pressure of a chlorine gas.

In particular, when m is not less than 5%, the (N/Ga) ratio in the post-etching surface of the GaN substrate is not more than 0.75 which is considerably smaller than the (N/Ga) ratio greater than 1.0 in the post-etching surface of the GaN substrate etched using only a chlorine gas. The (N/Ga) ratio in the post-etching surface of the GaN substrate further decreases as m increases, and reaches 0.55 when m is 20%.

For example, reactive ion etching (RIE), electron cyclotron resonance (ECR) etching or the like may be used, although the ICP etching is used as the dry etching in this preferred embodiment.

Next, after the etching, the n-type electrode is formed on the etching surface, and a nitride semiconductor device is obtained.

At this time, the n-type electrode is made of, for example, Ti/Al/Ti/Pt/Au and the like.

The nitride semiconductor device manufactured in this manner has the (N/Ga) ratio of less than 1 in the post-etching surface of the GaN substrate on which the n-type electrode is to be provided. Therefore, the contact resistance (Rc) of the n-type electrode takes a low value not obtainable by the dry etching using only the chlorine gas without the need to perform heat treatment at a temperature of not less than 400° C. There is no increase in the resistance of the p-type electrode due to degradation because of the absence of a heat treatment step at a temperature of not less than 400° C.

In particular, when the oxygen content (m) in the above-mentioned etching gas mixture of chlorine and oxygen is 5 to 20%, the (N/Ga) ratio in the etching surface of the GaN substrate on which the n-type substrate is to be provided is 0.75 to 0.55. That is, the surface contains a lot of gallium in such a manner that the (N/Ga) ratio is not more than 0.75. Therefore, Rc is not more than one-tenth that obtained by the dry etching using only the chlorine gas.

Crystal defects occur in GaN if the proportion of Ga is increased. As the amounts of such crystal defects increase, the resistance of GaN increases. However, because the (N/Ga) ratio is not less than 0.55, the amounts of crystal defects in the surface of the GaN substrate on which the n-type electrode is to be provided are not large. This suppresses the amount of increase in Rc due to the crystal defects, and maintains the Rc value that is not more than one-tenth that obtained by the dry etching using only the chlorine gas.

Second Preferred Embodiment

A method of manufacturing a nitride semiconductor device according to this preferred embodiment is such that a heat treatment step at a temperature of 350 to 390° C. in an inert gas with a small amount of oxygen added thereto is provided after the formation of the n-type electrode in the method of manufacturing the nitride semiconductor device of the first preferred embodiment. The addition of the small amount of oxygen removes nitrogen in an unstable state at an n-type electrode interface to stabilize the contact resistance (Rc) of the n-type electrode.

The above-mentioned effect is not produced if a heat treatment temperature is less than 350° C. The p-type electrode is degraded and the resistance value thereof is increased if the heat treatment temperature is higher than 390° C. Although heat treatment time is preferably not less than two minutes, the same effect is produced if this time is prolonged. If this time is too long, the manufacturing time of the nitride semiconductor device becomes long. Thus, the heat treatment time is preferably up to about 10 minutes. The above-mentioned effect is not produced if the heat treatment time is less than two minutes.

The inert gas for use in this heat treatment includes a noble gas such as nitrogen, argon and xenon. The concentration of oxygen is preferably such that the value (n) representing the oxygen partial pressure with respect to the pressure of the gas mixture (processing atmosphere) in percentage is 1 to 10%. If the oxygen concentration (n) is less than 5%, the effect of stabilizing the contact resistance of the n-type electrode is not produced. If the oxygen concentration (n) is more than 15%, the n-type electrode and the p-type electrode are oxidized, which is not preferable.

EXAMPLES

The present invention will be illustrated in more detail by reference to the following examples.

Example 1

A GaN substrate is prepared such that a back surface is doped with an n-type impurity, a nitride semiconductor layer is formed on a main surface side, and a p-type electrode is formed on this semiconductor layer surface.

Next, the back surface of the above-mentioned GaN substrate is ground about 300 μm by using a grinding machine. Thereafter, a diamond slurry is used to planarize the surface. Finally, polishing with a polishing cloth is performed by using alumina as an abrasive, whereby the GaN substrate has a thickness of about 100 μm.

Next, the polished surface of the above-mentioned GaN substrate is dry etched by the ICP process using a gas mixture of chlorine and oxygen with an oxygen content (in) of 10%. Etching conditions in this case include a temperature of 30° C., a pressure of 0.3 Pa, a gas flow rate of 35 sccm, a bias power of 40 W, and etching time is the time over which an etching amount reaches about 2 μm.

The dry etching surface of the above-mentioned GaN substrate was analyzed by X-ray photoelectron spectroscopy, and the (N/Ga) ratio for the dry etching surface was determined.

An evaluation nitride semiconductor device is manufactured by forming two n-type electrodes made of Ti/Al/Ti/Pt/Au and having a contact area of 0.06 mm$^2$ on the dry etching surface of the above-mentioned GaN substrate. The contact resistance (Rc) was determined by measuring a voltage causing a current of 1 mA to flow between the two n-type electrodes of this evaluation nitride semiconductor device.

The obtained (N/Ga) ratio, (Rc), and the presence/absence of the degradation of the p-type electrode which was judged depending on whether or not the resistance exceeded an allowable value were shown in Table 1.

Examples 2 to 5

An evaluation nitride semiconductor device is manufactured in a similar manner to Example 1 except that the oxygen content (m) in the gas mixture of chlorine and oxygen for use in the dry etching is that shown in Table 1. The obtained (N/Ga) ratio, (Rc), and the presence/absence of the degradation of the p-type electrode which was judged depending on whether or not the resistance exceeded the allowable value were shown in Table 1.

Example 6

An evaluation nitride semiconductor device is manufactured in a similar manner to Example 1 except that the pressure of the gas mixture of chlorine and oxygen for use in the dry etching is 0.5 Pa. The obtained (N/Ga) ratio, (Rc), and the presence/absence of the degradation of the p-type electrode which was judged depending on whether or not the resistance exceeded the allowable value were shown in Table 1.

Example 7

An evaluation nitride semiconductor device is manufactured in a similar manner to Example 1 except that an RIE process is used as the dry etching process and the etching conditions include a pressure of 2 Pa, a gas flow rate of 35 sccm, and an RF power of 100 W. The obtained (N/Ga) ratio, (Rc), and the presence/absence of the degradation of the p-type electrode which was judged depending on whether or not the resistance exceeded the allowable value were shown in Table 1.

Comparative Example 1

An evaluation nitride semiconductor device is manufactured in a similar manner to Example 1 except that only chlorine is used as the etching gas for use in the dry etching. The obtained (N/Ga) ratio, (Rc), and the presence/absence of the degradation of the p-type electrode which was judged depending on whether or not the resistance exceeded the allowable value were shown in Table 1.

It was apparent from Table 1 that the contact resistances (Rc) of the n-type electrodes of the nitride semiconductor devices obtained by the manufacturing methods of Examples 1 to 7 in which the etching process was performed using the gas mixture of chlorine and oxygen as the etching gas were sufficiently small as compared with that of the nitride semiconductor device obtained by performing the etching process using only chlorine as the etching gas in Comparative Example 1. In particular, the contact resistances (Rc) of the n-type electrodes of the nitride semiconductor devices obtained by the manufacturing methods of Examples 1 to 3 and Examples 6 and 7 in which the etching process was performed using the gas mixture of chlorine and oxygen such that m was 5 to 20% were not more than one-tenth that of the nitride semiconductor device obtained by the manufacturing method of Comparative Example 1.

Because the manufacturing methods of Examples 1 to 7 did not include a heat treatment step at a temperature of not less than 400° C., the obtained nitride semiconductor devices did not exhibit the degradation of the p-type electrode such that the resistance exceeded the allowable value.

That is, the manufacturing methods of Examples 1 to 7 produce the effect of providing the nitride semiconductor devices having the contact resistance of the n-type electrode at a level usable for a high-power LD. The manufacturing methods of Examples 1 to 3 and Examples 6 and 7 produce the above-mentioned effect remarkably.

TABLE 1

| | Etching Gas | | | | | Presence/Absence |
| --- | --- | --- | --- | --- | --- | --- |
| | Etching Method | m (%) | Pressure (Pa) | (N/Ga) Ratio | Rc (Ω) | of Degradation of p-Type Electrode |
| Example 1 | ICP | 10 | 0.3 | 0.7 | 1.8 | Absent |
| Example 2 | ICP | 5 | 0.3 | 0.75 | 5.1 | Absent |
| Example 3 | ICP | 20 | 0.3 | 0.55 | 0.01 | Absent |
| Example 4 | ICP | 4 | 0.3 | 0.85 | 12 | Absent |
| Example 5 | ICP | 22 | 0.3 | 0.5 | 7.2 | Absent |
| Example 6 | ICP | 10 | 0.5 | 0.66 | 0.31 | Absent |
| Example 7 | RIE | 10 | 2 | 0.62 | 0.09 | Absent |
| Comparative Example 1 | ICP | 0 | 0.3 | 1.1 | 62 | Absent |

Example 8

An evaluation nitride semiconductor device is manufactured in a similar manner to Example 1 except that heat treatment at a heat treatment temperature of 350° C. for five minutes is performed in an atmosphere of a gas mixture of nitrogen and oxygen with an oxygen concentration (n) of 5% after the n-type electrode is formed on the dry etching surface of the GaN substrate. At the same time, one hundred evaluation nitride semiconductor devices were prepared, and the average (Rca) and variation width (σr) of the contact resistances of the n-type electrodes of the one hundred evaluation nitride semiconductor devices were determined, and were shown in Table 2 together with the presence/absence of the degradation of the p-type electrode which was judged depending on whether or not the resistances exceeded the allowable value.

Examples 9 to 11

One hundred evaluation nitride semiconductor devices were prepared in a similar manner to Example 8 except that heat treatment was performed in which the oxygen concentration (n) in the atmosphere during the heat treatment and the heat treatment temperature were those shown in Table 2. The average (Rca) and variation width (σr) of the contact resistances of the n-type electrodes of the one hundred evaluation nitride semiconductor devices were determined, and were shown in Table 2 together with the presence/absence of the degradation of the p-type electrode which was judged depending on whether or not the resistances exceeded the allowable value.

Comparative Example 2

One hundred evaluation nitride semiconductor devices were prepared by the manufacturing method of Example 1. The average (Rca) and variation width (σr) of the contact resistances of the n-type electrodes of the one hundred evaluation nitride semiconductor devices were determined, and were shown in Table 2 together with the presence/absence of the degradation of the p-type electrode which was judged depending on whether or not the resistances exceeded the allowable value.

Comparative Example 3

One hundred evaluation nitride semiconductor devices were prepared in a similar manner to Example 8 except that heat treatment was performed in which the oxygen concentration (n) in the processing atmosphere during the heat treatment was 15% and the heat treatment temperature was 345° C. The average (Rca) and variation width (σr) of the contact resistances of the n-type electrodes of the one hundred evaluation nitride semiconductor devices were determined, and were shown in Table 2 together with the presence/absence of the degradation of the p-type electrode which was judged depending on whether or not the resistances exceeded the allowable value.

Comparative Examples 4 and 5

One hundred evaluation nitride semiconductor devices were prepared in a similar manner to Example 8 except that heat treatment was performed in which the oxygen concentration (n) in the processing atmosphere during the heat treatment and the heat treatment temperature were those shown in Table 2, and were shown in Table 2 together with the presence/absence of the degradation of the p-type electrode which was judged depending on whether or not the resistances exceeded the allowable value.

It is apparent from Table 2 that the variation in the contact resistances of the n-type electrodes can be reduced without degrading the p-type electrode by performing heat treatment such that the oxygen concentration (n) represented by the partial pressure percentage in the processing atmosphere is 5 to 15% and the temperature is 350 to 390° C.

TABLE 2

| | Heat Treatment Conditions | | | | Presence/Absence |
|---|---|---|---|---|---|
| | n (%) | Temperature (° C.) | Rca (Ω) | σr (Ω) | of Degradation of p-Type Electrode |
| Example 8 | 5 | 350 | 1.8 | ±0.42 | Absent |
| Example 9 | 5 | 390 | 1.8 | ±0.38 | Absent |
| Example 10 | 15 | 350 | 1.8 | ±0.36 | Absent |
| Example 11 | 15 | 390 | 1.8 | ±0.31 | Absent |
| Comparative Example 2 | No Heat Treatment | | 1.8 | ±0.91 | Absent |
| Comparative Example 3 | 15 | 345 | 1.8 | ±0.89 | Absent |
| Comparative Example 4 | 16 | 350 | — | — | Present |
| Comparative Example 5 | 5 | 400 | — | — | Present |

While the invention has been described in detail, the foregoing description is in all aspects illustrative and should not be construed as restrictive. It is understood that numerous other modifications and variations can be devised without departing from the scope of the invention. The scope of the invention is intended to be defined only by the claims.

What is claimed is:

1. A method of manufacturing a nitride semiconductor device using a GaN substrate, the method comprising
    a step of forming a nitride semiconductor layer on a GaN substrate main surface;
    a step of polishing a back surface of the GaN substrate formed with the above-mentioned nitride semiconductor layer;
    a step of dry etching the back surface of the GaN substrate subjected to the above-mentioned polishing by using a gas mixture of chlorine and oxygen;
    a step of forming an n-type electrode on the back surface of the GaN substrate subjected to the above-mentioned dry etching; and
    after the step of forming an n-type electrode on the back surface of the GaN substrate, a heat treatment step at a temperature of 350° C. to 390° C. in a gas mixture of oxygen and an inert gas containing 5 to 15% oxygen in partial pressure percentage to form an ohmic contact between the n-type electrode and the GaN substrate.

2. The method of manufacturing the nitride semiconductor device according to claim 1, wherein an oxygen content represented by a partial pressure percentage of oxygen in the gas mixture of chlorine and oxygen for use in the dry etching step of the back surface of the GaN substrate is 5 to 20%.

3. The method of manufacturing the nitride semiconductor device according to claim 1, wherein heat treatment step at a temperature of 350° C. to 390° C. is for a time in a range of from 2 to 10 minutes.

4. The method of manufacturing the nitride semiconductor device according to claim 1, wherein the inert gas is selected from the group consisting of nitrogen, argon and xenon.

* * * * *